(12) United States Patent
Kobayashi

(10) Patent No.: US 10,566,452 B2
(45) Date of Patent: Feb. 18, 2020

(54) SEMICONDUCTOR DEVICE AND CONTROL DEVICE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Kenya Kobayashi, Nonoichi (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/117,392

(22) Filed: Aug. 30, 2018

(65) Prior Publication Data

US 2019/0288102 A1   Sep. 19, 2019

(30) Foreign Application Priority Data

Mar. 19, 2018   (JP) .................................. 2018-050831

(51) Int. Cl.
*H01L 29/78*   (2006.01)
*H01L 27/06*   (2006.01)
(Continued)

(52) U.S. Cl.
CPC ...... *H01L 29/7813* (2013.01); *H01L 27/0617* (2013.01); *H01L 28/10* (2013.01);
(Continued)

(58) Field of Classification Search
CPC ............... H01L 29/7813; H01L 29/407; H01L 27/0617; H01L 28/10; H03K 17/6871
See application file for complete search history.

(56) References Cited

U.S. PATENT DOCUMENTS

2015/0207407 A1   7/2015 Nishiwaki
2015/0364562 A1   12/2015 Hokomoto et al.
(Continued)

FOREIGN PATENT DOCUMENTS

JP   2007-529115 A   10/2007
JP   2015-135927 A   7/2015
(Continued)

OTHER PUBLICATIONS

Franz Hirler, et al., "YFET—Trench Superjunction Process Window extended" Infineon Technologies AG, 2009, IEEE, 4 pages.
(Continued)

*Primary Examiner* — Mark V Prenty
(74) *Attorney, Agent, or Firm* — Oblon, McClelland, Maier & Neustadt, L.L.P.

(57) ABSTRACT

According to one embodiment, a semiconductor device includes a semiconductor element and a control device. The semiconductor element includes a first semiconductor region of a first conductivity type, a second semiconductor region of a second conductivity type, a third semiconductor region of the first conductivity type, a conductive portion, and a gate electrode. In a first operation, the control device changes a potential of the conductive portion from a first potential to a second potential. In a second operation, the control device changes a potential of the gate electrode from a third potential to a fourth potential. In a third operation, the control device changes the potential of the gate electrode from the fourth potential to the third potential. In a fourth operation, the control device changes the potential of the conductive portion from the second potential to the first potential after the third operation.

12 Claims, 9 Drawing Sheets

(51) Int. Cl.
  *H01L 49/02*  (2006.01)
  *H01L 29/40*  (2006.01)
  *H03K 17/687*  (2006.01)
  *H02M 1/08*  (2006.01)
  *H01L 29/08*  (2006.01)
  *H02P 7/292*  (2016.01)
  *H02M 3/158*  (2006.01)

(52) U.S. Cl.
  CPC ........ *H01L 29/0878* (2013.01); *H01L 29/407* (2013.01); *H02M 1/08* (2013.01); *H03K 17/6871* (2013.01); *H02M 3/158* (2013.01); *H02P 7/292* (2013.01)

(56) References Cited

U.S. PATENT DOCUMENTS

2016/0093719 A1  3/2016  Kobayashi et al.
2017/0263699 A1  9/2017  Kobayashi et al.
2018/0083110 A1  3/2018  Kobayashi et al.
2019/0252541 A1* 8/2019  Shimomura ........ H01L 29/7813

FOREIGN PATENT DOCUMENTS

JP      2016-4847 A       1/2016
WO   WO 2005/065385 A2   7/2005
WO   WO 2005/065385 A3   7/2005

OTHER PUBLICATIONS

Steven T. Peake, et al., "A Novel High Side FET with Reduced Switching Losses", ISPSD 2003, Philips Power Semiconductors, 4 pages.

* cited by examiner

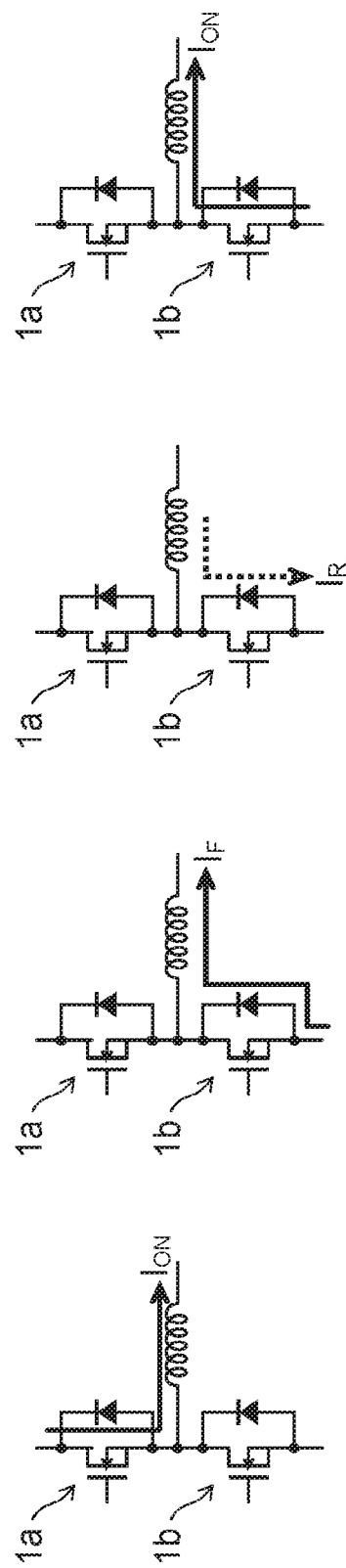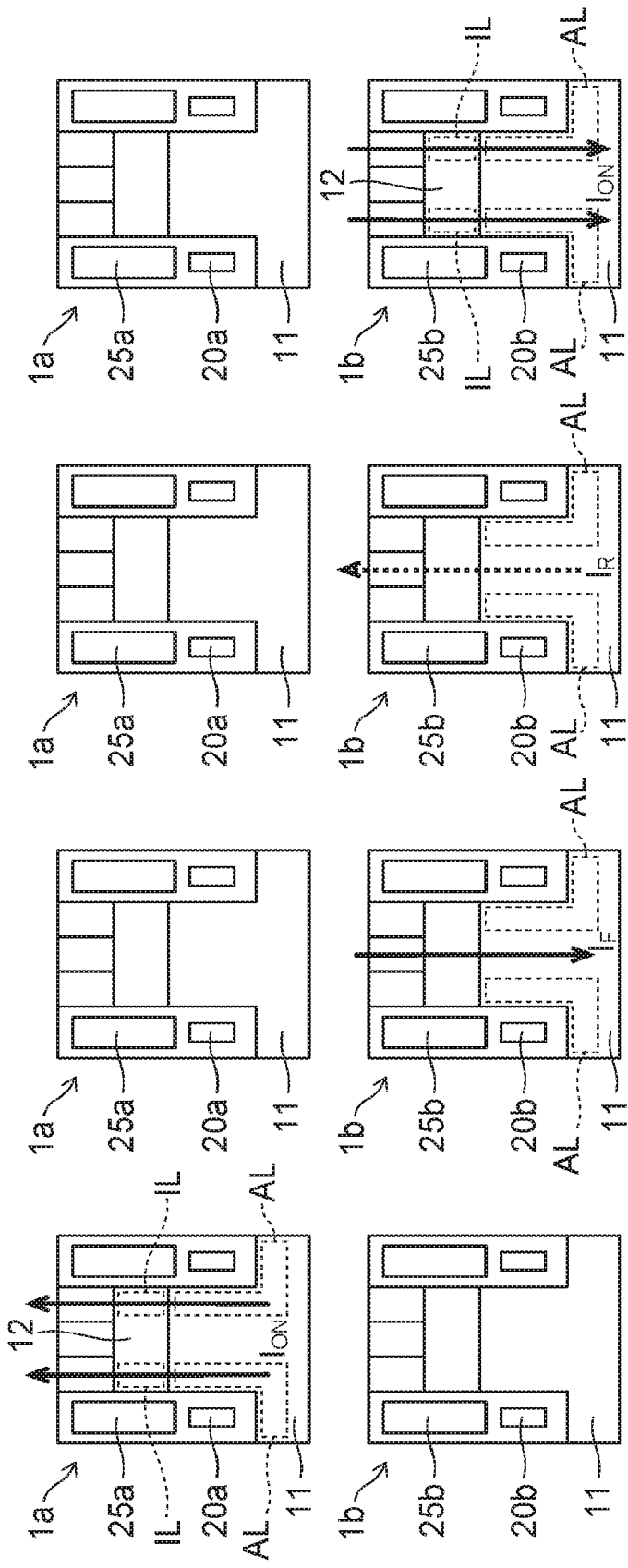
FIG. 4A  FIG. 4B  FIG. 4C  FIG. 4D

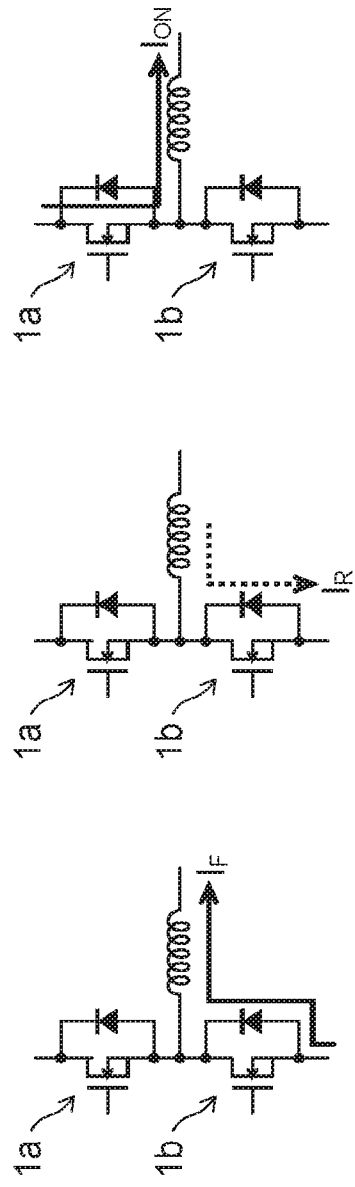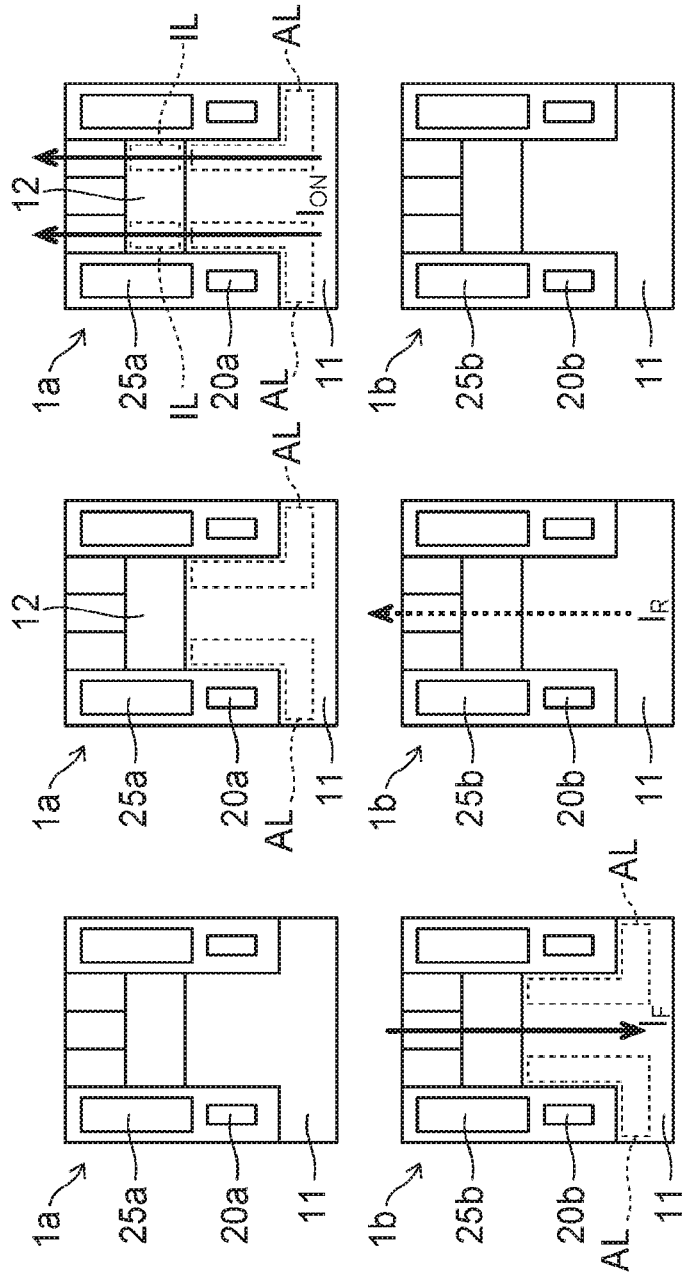
FIG. 5A  FIG. 5B  FIG. 5C

SEMICONDUCTOR DEVICE AND CONTROL DEVICE

CROSS-REFERENCE TO RELATED APPLICATIONS

This application is based upon and claims the benefit of priority from Japanese Patent Application No. 2018-050831, filed on Mar. 19, 2018; the entire contents of which are incorporated herein by reference.

FIELD

Embodiments described herein relate generally to a semiconductor device and a control device.

BACKGROUND

A semiconductor device such as a MOSFET (Metal Oxide Semiconductor Field Effect Transistor) or the like is used in applications such as power conversion, etc. Low power consumption of the semiconductor device is desirable.

BRIEF DESCRIPTION OF THE DRAWINGS

FIG. 4A to FIG. 5C are schematic views illustrating operations of the electrical circuit illustrated in FIG. 3;

DETAILED DESCRIPTION

Figure 1:
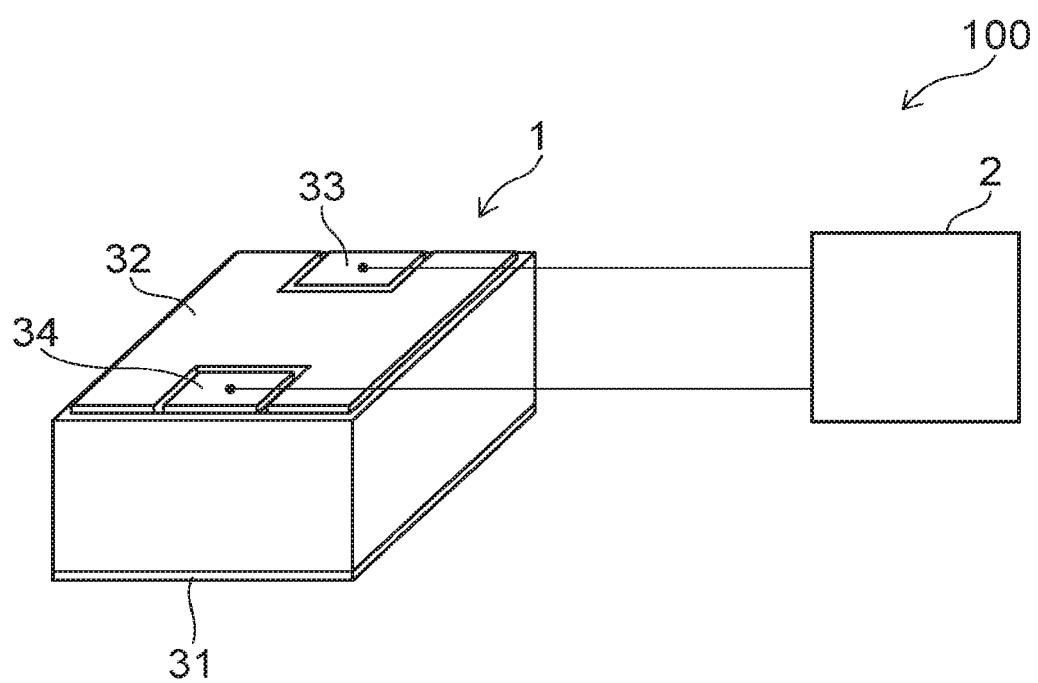
FIG. 1 is a schematic view illustrating a semiconductor device according to an embodiment.

According to one embodiment, a semiconductor device includes a semiconductor element and a control device. The semiconductor element includes a first semiconductor region of a first conductivity type, a second semiconductor region of a second conductivity type, a third semiconductor region of the first conductivity type, a conductive portion, and a gate electrode. The second semiconductor region is provided on the first semiconductor region. The third semiconductor region is provided on a portion of the second semiconductor region. The conductive portion is provided inside the first semiconductor region with a first insulating portion interposed. The gate electrode is provided on the conductive portion with a second insulating portion interposed. The gate electrode opposes, in a second direction with a gate insulating portion interposed, a portion of the first semiconductor region, the second semiconductor region, and at least a portion of the third semiconductor region. The second direction is perpendicular to a first direction. The first direction is from the first semiconductor region toward the second semiconductor region. The control device is electrically connected to the conductive portion and the gate electrode. The control device performs a first operation, a second operation, a third operation, and a fourth operation. In the first operation, the control device changes a potential of the conductive portion from a first potential to a second potential. The second potential has a larger absolute value than the first potential. In the second operation, the control device switches the semiconductor element to an on-state by changing a potential of the gate electrode from a third potential to a fourth potential. The fourth potential has a larger absolute value than the third potential. In the third operation, the control device switches the semiconductor element to an off-state after the first operation and the second operation by changing the potential of the gate electrode from the fourth potential to the third potential. In the fourth operation, the control device changes the potential of the conductive portion from the second potential to the first potential after the third operation.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following descriptions and drawings, notations of $n^+$, $n^-$ and $p^+$, $p$ represent relative height of an impurity concentration in conductive types. That is, the notation with "+" shows a relatively higher impurity concentration than an impurity concentration for the notation without any of "+" and "−". The notation with "−" shows a relatively lower impurity concentration than the impurity concentration for the notation without any of them. These notations represent relative height of a net impurity concentration after mutual compensation of these impurities when respective regions include both of a p-type impurity and an n-type impurity.

The embodiments described below may be implemented by reversing the p-type and the n-type of the semiconductor regions.

FIG. 1 is a schematic view illustrating a semiconductor device according to an embodiment.

Figure 2:
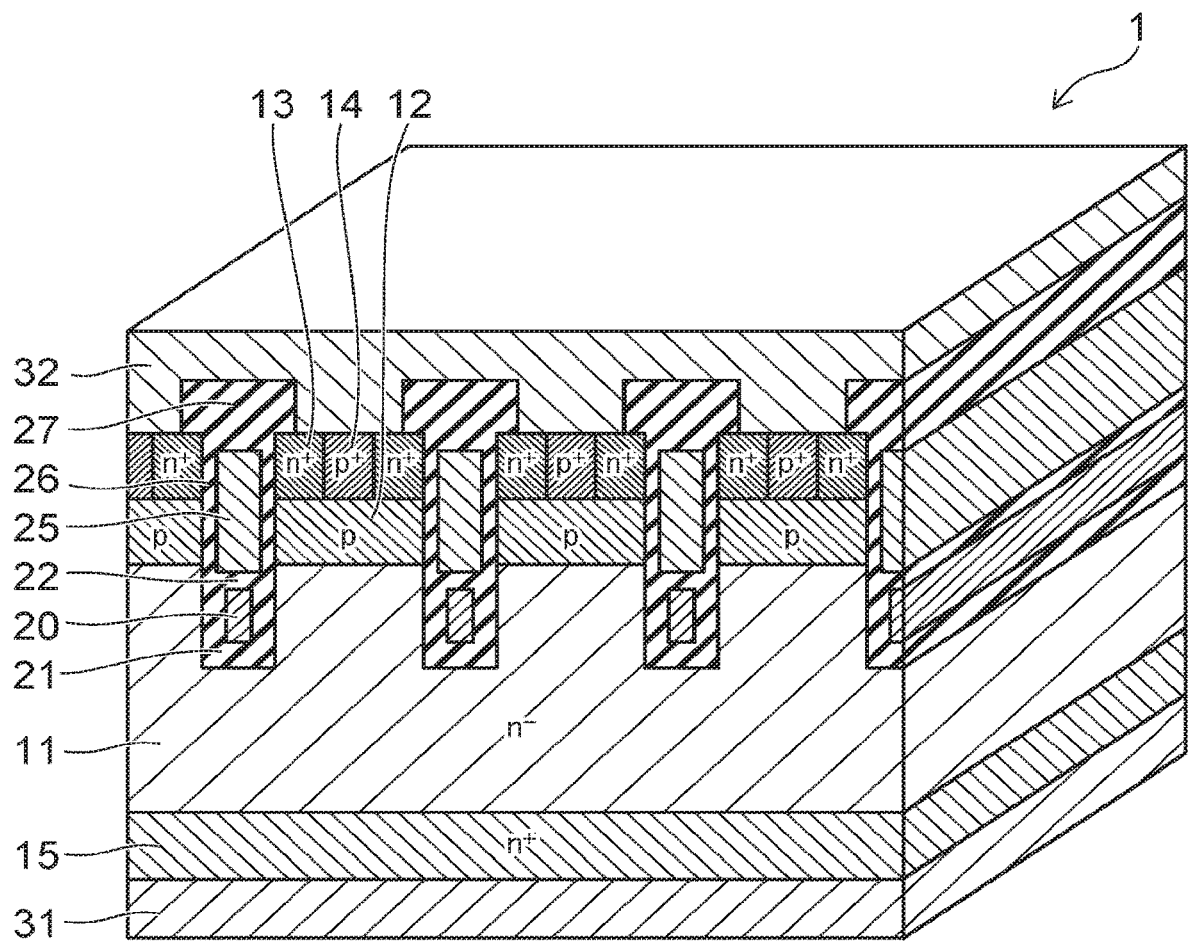
FIG. 2 is a perspective cross-sectional view illustrating a portion of a semiconductor element included in the semiconductor device according to the embodiment.

FIG. 2 is a perspective cross-sectional view illustrating a portion of a semiconductor element included in the semiconductor device according to the embodiment.

As illustrated in FIG. 1, the semiconductor device 100 according to the embodiment includes a semiconductor element 1 and a control device 2 (control circuitry). A source electrode 32, a pad electrode 33, and a pad electrode 34 are provided at the upper surface of the semiconductor element 1. The source electrode 32, the pad electrode 33, and the pad electrode 34 are separated from each other and electrically isolated from each other. A drain electrode 31 is provided at the lower surface of the semiconductor element 1. The control device 2 is electrically connected to the pad electrode 33 and the pad electrode 34.

As illustrated in FIG. 2, the semiconductor element 1 further includes an $n^-$-type drift region 11 (a first semiconductor region), a p-type base region 12 (a second semiconductor region), an $n^+$-type source region 13 (a third semiconductor region), a $p^+$-type contact region 14, an $n^+$-type drain region 15, a conductive portion 20, a first insulating portion 21, a second insulating portion 22, and a gate electrode 25.

An XYZ orthogonal coordinate system is used in the description of the embodiment. A direction from the n⁻-type drift region 11 toward the p-type base region 12 is taken as a Z-direction (a first direction). Two mutually-orthogonal directions perpendicular to the Z-direction are taken as an X-direction (a second direction) and a Y-direction (a third direction). For the description, the direction from the n⁻-type drift region 11 toward the p-type base region 12 is called "up;" and the reverse direction is called "down." These directions are based on the relative positional relationship between the n⁻-type drift region 11 and the p-type base region 12 and are independent of the direction of gravity.

The n⁺-type drain region 15 is provided on the drain electrode 31 and is electrically connected to the drain electrode 31. The n⁻-type drift region 11 is provided on the n⁺-type drain region 15. The p-type base region 12 is provided on the n⁻-type drift region 11. The n⁺-type source region 13 and the p⁺-type contact region 14 are provided on the p-type base region 12.

The conductive portion 20 is provided inside the n⁻-type drift region 11 with the first insulating portion 21 interposed. The gate electrode 25 is provided on the conductive portion 20 with the second insulating portion 22 interposed. The gate electrode 25 opposes, in the X-direction with a gate insulating portion 26 interposed, a portion of the n⁻-type drift region 11, the p-type base region 12, and at least a portion of the n⁺-type source region 13.

The source electrode 32 is electrically connected to the n⁺-type source region 13 and the p⁺-type contact region 14. An insulating layer 27 is provided between the gate electrode 25 and the source electrode 32. The conductive portion 20 is electrically connected to the pad electrode 33 illustrated in FIG. 1. The gate electrode 25 is electrically connected to the pad electrode 34.

For example, the p-type base region 12, the n⁺-type source region 13, the p⁺-type contact region 14, the conductive portion 20, and the gate electrode 25 each are multiply provided in the X-direction and extend in the Y-direction.

The control device 2 is electrically connected to the conductive portion 20 and the gate electrode 25 respectively via the pad electrode 33 and the pad electrode 34 illustrated in FIG. 1. The control device 2 individually controls the potentials of the conductive portion 20 and the gate electrode 25.

For example, the control device 2 sets the potential of the gate electrode 25 to one of a third potential or a fourth potential. The absolute value of the fourth potential is greater than the absolute value of the third potential. The absolute value of the fourth potential is greater than the absolute value of the threshold for switching the semiconductor element 1 to an on-state. The absolute value of the third potential is less than the absolute value of the threshold. For example, the reference of the potential is set to the potential of the source electrode 32.

For example, the absolute value of the potential of the drain electrode 31 is set to be greater than the absolute value of the potential of the source electrode 32. When the potential of the gate electrode 25 is switched from the third potential to the fourth potential in this state, a channel (an inversion layer) is formed in the region of the p-type base region 12 at the gate insulating portion 26 vicinity; and the semiconductor element 1 is set to the on-state. For example, electrons pass through the channel and flow from the source electrode 32 toward the drain electrode 31. Subsequently, when the potential applied to the gate electrode 25 is switched from the fourth potential to the third potential, the channel of the p-type base region 12 is annihilated; and the semiconductor element 1 is set to an off-state.

The control device 2 sets the potential of the conductive portion 20 to one of a first potential or a second potential. The absolute value of the second potential is greater than the absolute value of the first potential. For example, the absolute value of the second potential is greater than the absolute value of the threshold recited above. The absolute value of the first potential is less than the absolute value of the threshold recited above. The first potential and the third potential are, for example, a reference potential (ground).

For example, in the case where the semiconductor element 1 is an n-channel MOS, the fourth potential is a potential that is the threshold or more and is higher than the third potential. The second potential is a potential that is the threshold or more and is higher than the first potential.

In the case where the semiconductor element 1 is a p-channel MOS, the fourth potential is a potential that is the threshold or less and is lower than the third potential. The second potential is a potential that is the threshold or less and is lower than the first potential.

Examples of the materials of the components of the semiconductor element 1 will now be described.

The n⁻-type drift region 11, the p-type base region 12, the n⁺-type source region 13, the p⁺-type contact region 14, and the n⁺-type drain region 15 include silicon, silicon carbide, gallium nitride, or gallium arsenide as the semiconductor material. In the case where silicon is used as the semiconductor material, arsenic, phosphorus, or antimony can be used as the n-type impurity. Boron can be used as the p-type impurity.

The conductive portion 20 and the gate electrode 25 include a conductive material such as polysilicon, etc.

The first insulating portion 21, the second insulating portion 22, the insulating layer 27, and the gate insulating portion 26 include an insulating material such as silicon oxide, etc.

The drain electrode 31, the source electrode 32, the pad electrode 33, and the pad electrode 34 include a metal such as aluminum, etc.

Operations of the semiconductor device 100 will now be described with reference to FIG. 3 to FIG. 6.

Figure 3:
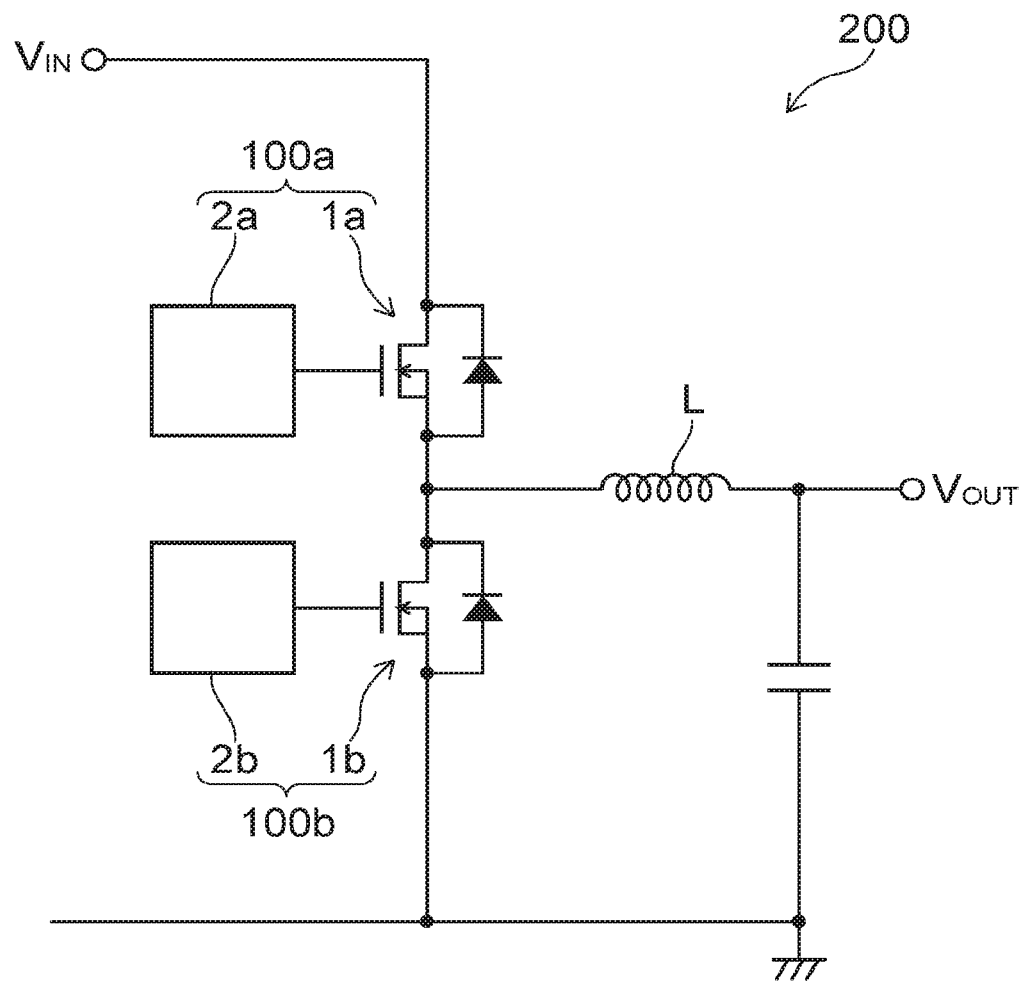
FIG. 3 is a circuit diagram of an electrical device including the semiconductor device according to the embodiment.

FIG. 3 is a circuit diagram of an electrical device including the semiconductor device according to the embodiment.

FIG. 4A to FIG. 5C are schematic views illustrating operations of the electrical circuit illustrated in FIG. 3.

Figure 6:
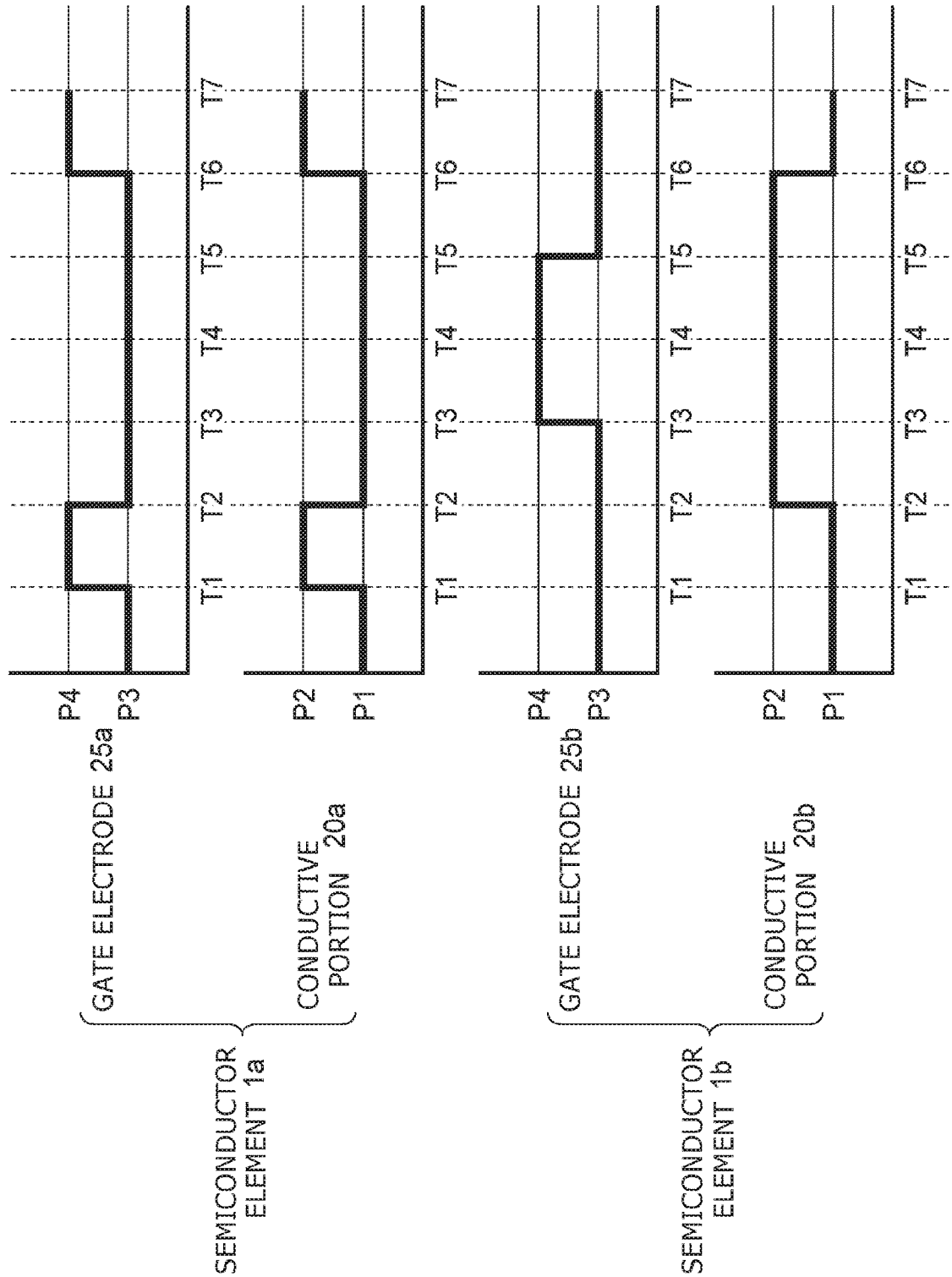
FIG. 6 is a time chart illustrating the operations of the electrical circuit illustrated in FIG. 3.

FIG. 6 is a time chart illustrating the operations of the electrical circuit illustrated in FIG. 3.

As illustrated in FIG. 3, the electrical device 200 includes a buck converter including two of the semiconductor devices according to the embodiment. In FIG. 3, the semiconductor device that is on the high-voltage side is illustrated as a semiconductor device 100a. The semiconductor device that is on the low-voltage side is illustrated as a semiconductor device 100b. The semiconductor device 100a includes a semiconductor element 1a and a control device 2a. The semiconductor device 100b includes a semiconductor element 1b and a control device 2b.

In the buck converter, the semiconductor element 1a on the high-voltage side and the semiconductor element 1b on the low-voltage side are alternately set to the on-state by the operations of the control devices 2a and 2b. Thereby, an output voltage $V_{OUT}$ that is lower than an input voltage $V_{IN}$ is output.

In FIG. 4A to FIG. 4D and FIG. 5A to FIG. 5C, the drawings of the upper level illustrate a portion of the electrical circuit illustrated in FIG. 3. The drawings of the middle level illustrate the state of the semiconductor element 1a. The drawings of the lower level illustrate the state of the semiconductor element 1b.

For example, a fourth potential P4 is applied to a gate electrode 25a of the semiconductor element 1a on the high-voltage side; and a third potential P3 is applied to a gate electrode 25b of the semiconductor element 1b on the low-voltage side (a timing T1 of FIG. 6). By applying the fourth potential P4 to the gate electrode 25a, an inversion layer IL is formed in the p-type base region 12 at the gate electrode 25a vicinity. Thereby, as illustrated in FIG. 4A, the semiconductor element 1a is turned on; and an on-current $I_{on}$ flows toward the output terminal in an inductor L of the circuit.

At this time, a second potential P2 is applied to a conductive portion 20a of the semiconductor element 1a; and a first potential P1 is applied to a conductive portion 20b of the semiconductor element 1b. By applying the second potential P2 to the conductive portion 20a of the semiconductor element 1a, an accumulation layer AL of electrons is formed in the n$^-$-type drift region 11 at the conductive portion 20 vicinity. The on-resistance of the semiconductor element 1a can be reduced.

Subsequently, the potential of the gate electrode 25a of the semiconductor element 1a is switched from the fourth potential P4 to the third potential P3 (a timing T2). Thereby, as illustrated in FIG. 4B, the inversion layer IL is annihilated; and the semiconductor element 1a is switched to the off-state. When the semiconductor element 1a is switched to the off-state, a freewheeling current $I_F$ flows in the built-in diode of the semiconductor element 1b so that the current continues to flow.

At this time, the potential of the conductive portion 20a of the semiconductor element 1a is switched from the second potential P2 to the first potential P1. The potential of the conductive portion 20b of the semiconductor element 1b is switched from the first potential P1 to the second potential P2. Thereby, in the semiconductor element 1b, the accumulation layer AL is formed in the n$^-$-type drift region 11 at the conductive portion 20b vicinity. The electron concentration of the n$^-$-type drift region 11 is increased by forming the accumulation layer AL. Because the freewheeling current $I_F$ that flows through the built-in diode is constant, the necessary current can be caused to flow while suppressing the injection of holes from the source electrode 32 into the n$^-$-type drift region 11.

Then, to turn-on the semiconductor element 1b, the potential of the gate electrode 25b of the semiconductor element 1b is switched from the third potential P3 to the fourth potential P4 (a timing T3). The electrons and the holes that are stored inside the semiconductor element 1b are discharged respectively from the drain electrode 31 and the source electrode 32 directly after the fourth potential P4 is applied to the gate electrode 25b. Thereby, as illustrated in FIG. 4C, a recovery current $I_R$ flows through the semiconductor element 1b. When the electrons and the holes that are stored in the semiconductor element 1b are discharged, the on-current $I_{on}$ flows in the semiconductor element 1b as illustrated in FIG. 4D (a timing T4).

Subsequently, the potential of the gate electrode 25b of the semiconductor element 1b is switched from the fourth potential P4 to the third potential P3 (a timing T5). As illustrated in FIG. 5A, when the semiconductor element 1b is switched to the off-state, the freewheeling current $I_F$ flows in the built-in diode of the semiconductor element 1b so that the current continues to flow in the inductor L. At this time, the potential of the conductive portion 20b of the semiconductor element 1b is maintained at the second potential P2. In the semiconductor element 1b, the electron concentration of the n$^-$-type drift region 11 increases by the accumulation layer AL continuing to be formed in the n$^-$-type drift region 11. Because the freewheeling current $I_F$ that flows through the built-in diode is constant, the necessary current can be caused to flow while suppressing the injection of the holes from the source electrode 32 into the n$^-$-type drift region 11.

Then, to turn-on the semiconductor element 1a, the potential of the gate electrode 25a of the semiconductor element 1a is switched from the third potential P3 to the fourth potential P4 (a timing T6). At this time, the potential of the conductive portion 20a of the semiconductor element 1a is switched from the first potential P1 to the second potential P2. The potential of the conductive portion 20b of the semiconductor element 1b is switched from the second potential P2 to the first potential P1. The electrons and the holes that are stored inside the semiconductor element 1b are discharged respectively from the drain electrode 31 and the source electrode 32 directly after the fourth potential P4 is applied to the gate electrode 25a. Thereby, as illustrated in FIG. 5B, the recovery current $I_R$ flows through the semiconductor element 1b. When the electrons and the holes that are stored inside the semiconductor element 1b are discharged, the on-current $I_{on}$ flows in the semiconductor element 1a as illustrated in FIG. 5C (a timing T7).

In other words, for example, the potential of the gate electrode 25a and the potential of the conductive portion 20a of the semiconductor element 1a on the high-voltage side are switched simultaneously. In the semiconductor element 1b on the low-voltage side, the gate electrode 25b is switched to the high potential after switching the conductive portion 20b to the high potential. Subsequently, the conductive portion 20b is switched to the low potential after switching the gate electrode 25b to the low potential. Thereby, the electron concentration of the n$^-$-type drift region 11 can be increased when the freewheeling current $I_F$ flows in the semiconductor element 1b. The injection of the holes from the source electrode 32 into the n$^-$-type drift region 11 can be suppressed.

Effects of the embodiment will now be described.

In the semiconductor device 100 according to the embodiment, the conductive portion 20 and the gate electrode 25 are electrically connected to the control device 2. The control device 2 individually controls the potentials of the conductive portion 20 and the gate electrode 25. Specifically, the control device 2 performs the following first operation, second operation, third operation, and fourth operation.

In the first operation, the control device 2 changes the potential of the conductive portion 20 from the first potential P1 to the second potential P2 having a larger absolute value than the first potential P1. Thereby, the accumulation layer AL is formed in the n$^-$-type drift region 11 at the conductive portion 20 vicinity. The on-resistance of the semiconductor element 1 can be reduced by forming the accumulation layer AL.

In the second operation, the control device 2 changes the potential of the gate electrode 25 from the third potential P3 to the fourth potential P4 having a larger absolute value than the third potential P3. Thereby, the inversion layer IL is formed in the p-type base region 12 at the gate electrode 25 vicinity; and the semiconductor element 1 is set to the on-state.

The timing of performing the first operation may be the same as the second operation or may be different from the second operation. In the example of FIG. 4A to FIG. 6, the first operation is performed before the second operation.

In the third operation, the control device 2 changes the potential of the gate electrode 25 from the fourth potential P4 to the third potential P3. The third operation is performed after the first operation and the second operation. Thereby, the inversion layer IL is annihilated; and the semiconductor element 1 is switched to the off-state.

In the fourth operation, the control device 2 changes the potential of the conductive portion 20 from the second potential P2 to the first potential P1. The fourth operation is performed after the third operation. Thereby, the accumulation layer AL is annihilated.

In the operations illustrated in FIG. 4A to FIG. 6, for example, the first operation corresponds to switching the potential of the conductive portion 20b at the timing T2. The second operation corresponds to switching the potential of the gate electrode 25b at the timing T3. The third operation corresponds to switching the potential of the gate electrode 25b at the timing T5. The fourth operation corresponds to switching the potential of the conductive portion 20b at the timing T6.

When switching the semiconductor element 1 from the on-state to the off-state, there are cases where a freewheeling current flows in the built-in diode of the semiconductor element 1. When the freewheeling current finishes flowing, a recovery current flows due to the electrons and the holes stored in the semiconductor element 1 being discharged. To reduce the power consumption of the semiconductor element 1, it is effective to reduce the recovery current.

To reduce the recovery current in the semiconductor device 100 according to the embodiment, the accumulation layer AL is formed at the conductive portion 20 vicinity after switching the semiconductor element 1 to the off-state. Thereby, the accumulation layer AL is formed at the conductive portion 20 vicinity also while the freewheeling current flows through the semiconductor element 1. The electrons that flow through the semiconductor element 1 are discharged efficiently into the source electrode 32. Thereby, the concentration of the electrons in the n$^-$-type drift region 11 is reduced; and the injection of the holes from the source electrode 32 into the n$^-$-type drift region 11 can be suppressed. In other words, the amount of the electrons and the amount of the holes stored in the n$^-$-type drift region 11 when the freewheeling current finishes flowing and the recovery current starts to flow can be reduced. As a result, the recovery current can be reduced; and the power consumption of the semiconductor element 1 can be reduced.

In the electrical device 200 illustrated in FIG. 3 to FIG. 6, the control device 2 further performs the following second operation, third operation, and first operation.

In the second operation, the potential of the gate electrode 25a of the semiconductor element 1a is changed from the third potential P3 to the fourth potential P4. Thereby, the semiconductor element 1a is switched to the on-state.

In the third operation after the second operation, the potential of the gate electrode 25a is changed from the fourth potential P4 to the third potential P3. Thereby, the semiconductor element 1a switched from the on-state to the off-state. By switching the semiconductor element 1a to the off-state, the freewheeling current $I_F$ flows in the semiconductor element 1b after the third operation.

In the first operation after the third operation, the potential of the conductive portion 20b of the semiconductor element 1b is changed from the first potential P1 to the second potential P2. Thereby, the accumulation layer AL is formed in the n$^-$-type drift region 11 of the semiconductor element 1b when the freewheeling current $I_F$ flows in the semiconductor element 1b. The timing of performing the first operation may be simultaneous with the third operation or may be different from the third operation.

In the example illustrated in FIG. 4A to FIG. 6, for example, the second operation and the third operation correspond to switching the potential of the gate electrode 25a respectively at the timings T1 and T2. The first operation corresponds to switching the potential of the conductive portion 20b at the timing T2.

The accumulation layer AL is formed in the semiconductor element 1b when the semiconductor element 1a is switched from the on-state to the off-state and the freewheeling current $I_F$ flows in the semiconductor element 1b. Thereby, the power consumption of the semiconductor element 1b can be reduced.

In FIG. 3, the control devices 2a and 2b are connected respectively to the semiconductor elements 1a and 1b. One control device may be connected to the semiconductor elements 1a and 1b. In the example described above, a buck converter is configured using the semiconductor device according to the embodiment. A boost converter or the like also may be configured using the semiconductor device according to the embodiment. Or, a bridge circuit described below may be configured using the semiconductor device according to the embodiment.

Figure 7:
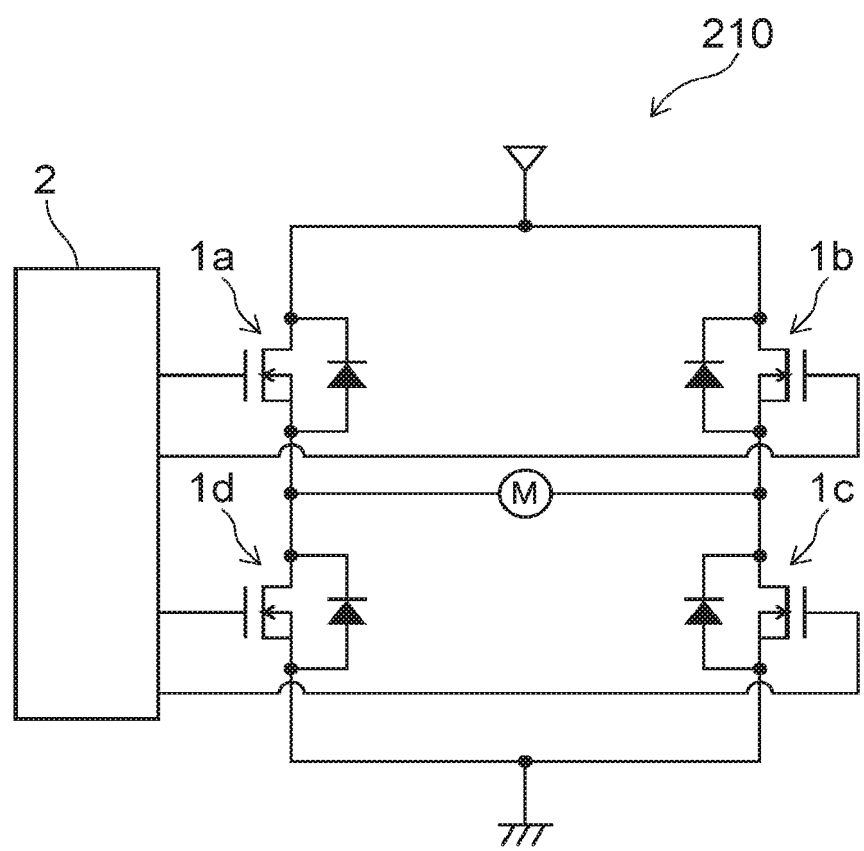
FIG. 7 is a circuit diagram of another electrical device including the semiconductor device according to the embodiment.

FIG. 7 is a circuit diagram of another electrical device including the semiconductor device according to the embodiment.

FIGS. 8A to 8F are schematic views illustrating the operations of the electrical circuit illustrated in FIG. 7.

Figure 9:
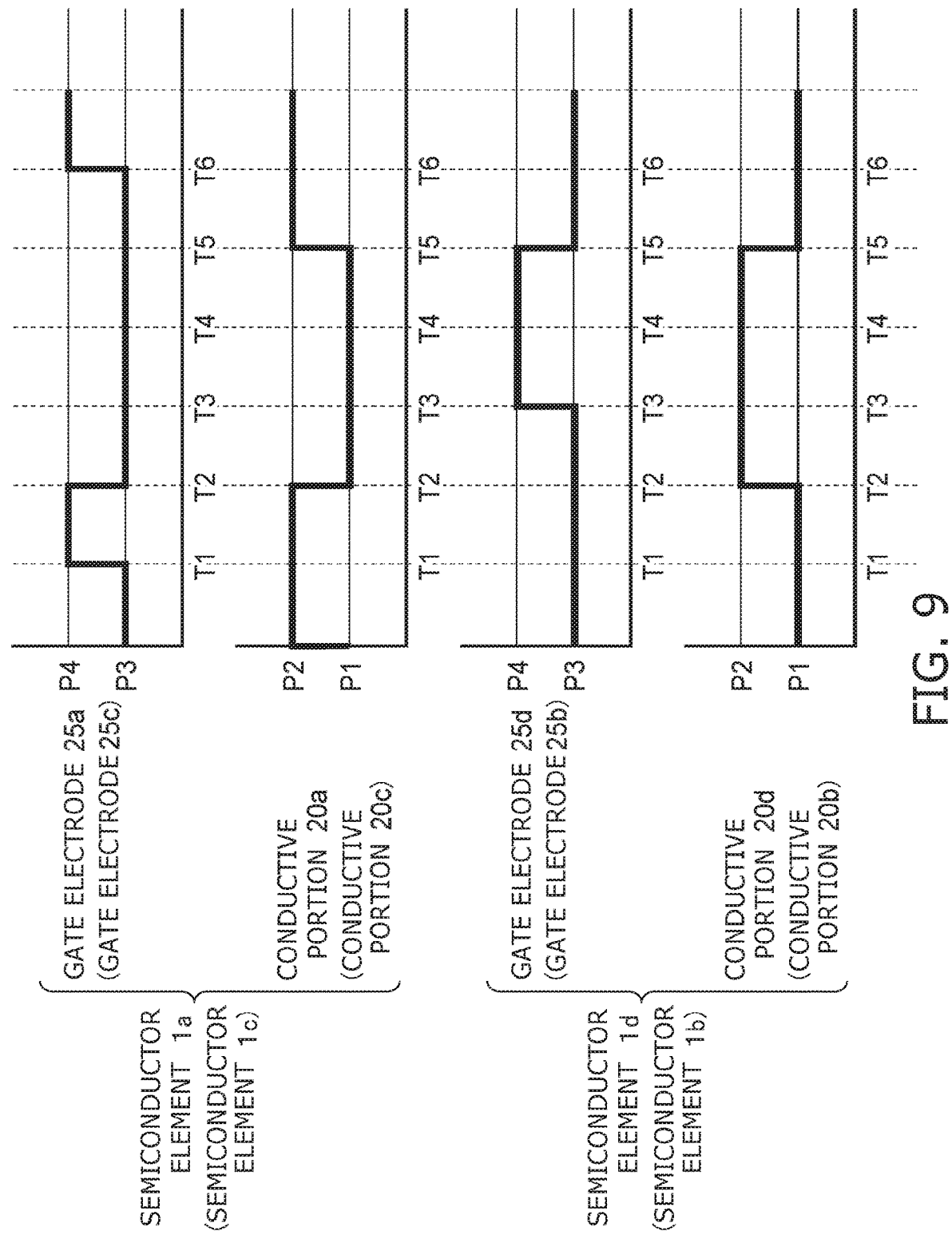
FIG. 9 is a time chart illustrating the operations of the electrical circuit illustrated in FIG. 7.

FIG. 9 is a time chart illustrating the operations of the electrical circuit illustrated in FIG. 7.

The electrical device 210 illustrated in FIG. 7 includes the multiple semiconductor elements 1a to 1d, the control device 2, and a motor M. In the electrical device 210, the semiconductor element 1a is connected in series to the semiconductor element 1d. The semiconductor element 1b is connected in series to the semiconductor element 1c. The semiconductor element 1a and the semiconductor element 1c are connected in series via the motor M (an inductor). The semiconductor element 1b and the semiconductor element 1d are connected in series via the motor M. The control device 2 is connected to the semiconductor elements 1a to 1d. The control device 2 controls the potentials of the conductive portion 20 and the gate electrode 25 of each of the semiconductor elements 1a to 1d.

For example, the fourth potential P4 is applied to the gate electrode 25a of the semiconductor element 1a and a gate electrode 25c of the semiconductor element 1c; and the third potential P3 is applied to a gate electrode 25d of the semiconductor element 1d and the gate electrode 25b of the semiconductor element 1b (the timing T1 of FIG. 9). Thereby, the on-current $I_{on}$ flows in the motor M and through the semiconductor elements 1a and 1c.

Figure 8A:
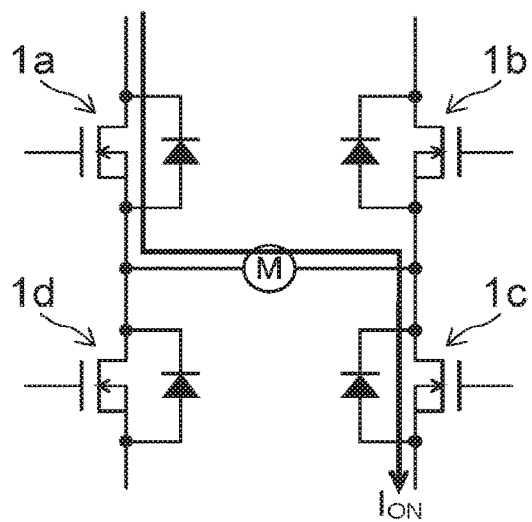
FIGS. 8A to 8F are schematic views illustrating the operations of the electrical circuit illustrated in FIG. 7.

Then, the potentials of the gate electrodes 25a and 25c are switched to the third potential P3 (the timing T2). Thereby, the semiconductor elements 1a and 1c are switched to the off-state. At this time, as illustrated in FIG. 8B, the freewheeling current $I_F$ flows in the built-in diodes of the semiconductor elements 1d and 1b; and the current continues to flow in the motor M. At the timing T2, the potential of a conductive portion 20d of the semiconductor element 1d and the potential of the conductive portion 20b of the semiconductor element 1b are switched from the first potential P1 to the second potential P2. Thereby, when the freewheeling current $I_F$ flows through the semiconductor elements 1d and 1b, the electron concentration of these semiconductor elements is increased; and the injection amount of the holes can be suppressed.

Continuing, the potential of the gate electrode 25d of the semiconductor element 1d and the potential of the gate electrode 25b of the semiconductor element 1b are switched from the third potential P3 to the fourth potential P4 (the timing T3). At this time, the electrons and the holes that are stored in the semiconductor elements 1d and 1b are discharged from these semiconductor elements. Thereby, as illustrated in FIG. 8C, the recovery current $I_R$ flows in the semiconductor elements 1d and 1b.

Figure 8D:
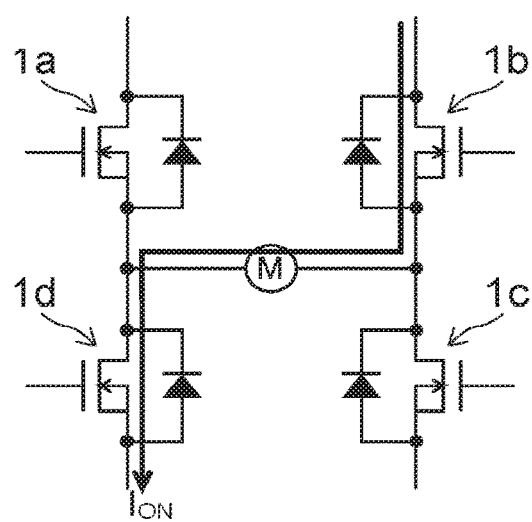
Figure 8B:
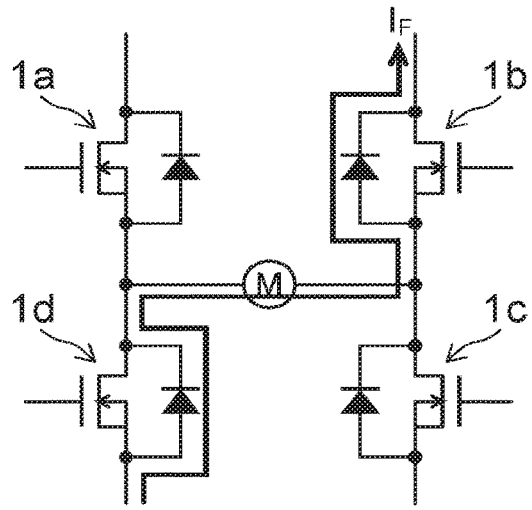

Then, the semiconductor elements 1d and 1b are switched to the on-state; and a current flows in the semiconductor element 1b, the motor M, and the semiconductor element 1d as illustrated in FIG. 8D (the timing T4). At this time, the second potential P2 is applied to the conductive portion 20d of the semiconductor element 1d and the conductive portion 20b of the semiconductor element 1b; and an accumulation layer is formed. Thereby, the on-resistance of the semiconductor elements 1d and 1b can be reduced.

Figure 8E:
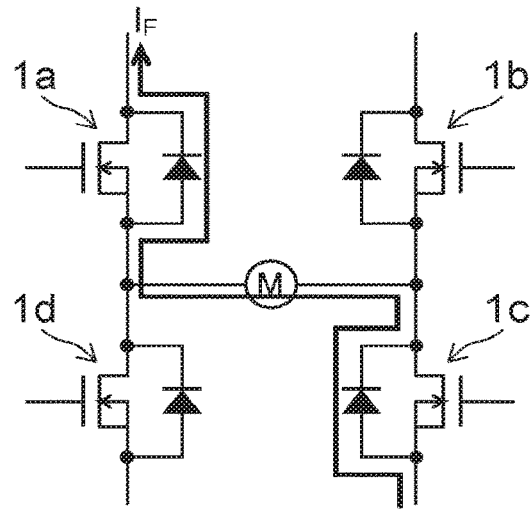
Figure 8C:
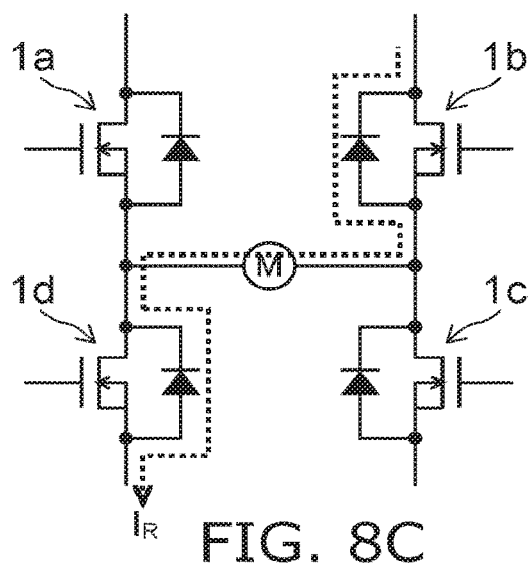

Continuing, the semiconductor elements 1d and 1b are switched to the off-state (the timing T5). Namely, the potential of the gate electrode 25d and the potential of the gate electrode 25b are switched from the fourth potential P4 to the third potential P3; and the potential of the conductive portion 20d and the potential of the conductive portion 20b are switched from the second potential P2 to the first potential P1. Thereby, as illustrated in FIG. 8E, the freewheeling current $I_F$ flows in the built-in diodes of the semiconductor elements 1a and 1c; and the current continues to flow in the motor M. At the timing T5, the potential of the conductive portion 20a of the semiconductor element 1a and the potential of a conductive portion 20c of the semiconductor element 1c are switched from the first potential P1 to the second potential P2. Thereby, when the freewheeling current $I_F$ flows through the semiconductor elements 1a and 1c, the electron concentration of these semiconductor elements can be increased; and the injection amount of the holes can be suppressed.

Figure 8F:
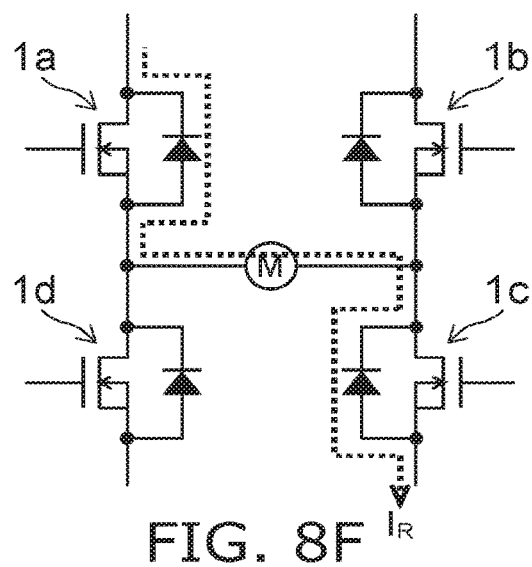

Then, the potential of the gate electrode 25a of the semiconductor element 1a and the potential of the gate electrode 25c of the semiconductor element 1c are switched from the third potential P3 to the fourth potential P4 (the timing T6). At this time, the electrons and the holes that are stored in the semiconductor elements 1d and 1b are discharged from these semiconductor elements. Thereby, as illustrated in FIG. 8F, the recovery current $I_R$ flows in the semiconductor elements 1a and 1c.

In the electrical device 210 illustrated in FIG. 7 to FIG. 9, the control device 2 performs the following second operation, third operation, and first operation.

In the second operation, the potential of the gate electrode 25 of one of the multiple semiconductor elements 1 (a first semiconductor element) is changed from the third potential P3 to the fourth potential P4 having a larger absolute value than the third potential P3. Thereby, the first semiconductor element is switched to the on-state.

In the third operation after the second operation, the potential of the gate electrode 25 of the first semiconductor element is changed from the fourth potential P4 to the third potential P3. Thereby, the first semiconductor element is switched to the off-state.

In the first operation after the third operation, the potential of the conductive portion 20 of another one of the multiple semiconductor elements 1 (a second semiconductor element) is changed from the first potential P1 to the second potential P2 having a larger absolute value than the first potential P1.

The timing of performing the first operation may be the same as the third operation or may be different from the third operation. Favorably, the timing of performing the first operation is the same as the third operation or before the third operation. According to the control method, the power consumption can be reduced because the accumulation layer AL is formed in the second semiconductor element when the freewheeling current starts to flow through the second semiconductor element.

In the operations illustrated in FIG. 8A to FIG. 9, for example, the second operation corresponds to switching the potential of the gate electrode 25a at the timing T1. The third operation corresponds to switching the potential of the gate electrode 25a at the timing T2. The first operation corresponds to switching the potential of the conductive portion 20d at the timing T2.

Or, the second operation corresponds to switching the potential of the gate electrode 25d at the timing T3. The third operation corresponds to switching the potential of the gate electrode 25d at the timing T5. The first operation corresponds to switching the potential of the conductive portion 20a at the timing T5.

After the third operation and the first operation, the control device 2 may change the potential of the gate electrode of the second semiconductor element recited above from the third potential to the fourth potential and further perform the other second operation of switching the second semiconductor element recited above to the on-state.

In the operations illustrated in FIG. 8A to FIG. 9, for example, the other second operation recited above corresponds to switching the potential of the gate electrode 25d at the timing T3 or switching the potential of the gate electrode 25a at the timing T6.

In the electrical device 210 illustrated in FIG. 7, the power consumption of the semiconductor element 1 can be reduced similarly to the example illustrated in FIG. 3 to FIG. 6 by the semiconductor device 100 performing the second operation, the third operation, and the first operation described above.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device, comprising:
a semiconductor element including
a first semiconductor region of a first conductivity type,
a second semiconductor region provided on the first semiconductor region, the second semiconductor region being of a second conductivity type,
a third semiconductor region provided on a portion of the second semiconductor region, the third semiconductor region being of the first conductivity type,
a conductive portion provided inside the first semiconductor region with a first insulating portion interposed, and
a gate electrode provided on the conductive portion with a second insulating portion interposed, the gate electrode opposing, in a second direction with a gate insulating portion interposed, a portion of the first semiconductor region, the second semiconductor region, and at least a portion of the third semiconductor region, the second direction being perpendicular to a first direction, the first direction being from the first semiconductor region toward the second semiconductor region; and
a control device electrically connected to the conductive portion and the gate electrode, the control device performing
a first operation of changing a potential of the conductive portion from a first potential to a second potential, the second potential having a larger absolute value than the first potential,
a second operation of switching the semiconductor element to an on-state by changing a potential of the gate electrode from a third potential to a fourth potential, the fourth potential having a larger absolute value than the third potential,
a third operation of switching the semiconductor element to an off-state after the first operation and the second operation by changing the potential of the gate electrode from the fourth potential to the third potential, and
a fourth operation of changing the potential of the conductive portion from the second potential to the first potential after the third operation.

2. The device according to claim 1, wherein the first operation is performed simultaneously with the second operation or before the second operation.

3. The device according to claim 1, comprising a plurality of the semiconductor elements,
the plurality of semiconductor elements including a first semiconductor element and a second semiconductor element,
the control device being electrically connected to the conductive portion and the gate electrode of the first semiconductor element and to the conductive portion and the gate electrode of the second semiconductor element,
before the first operation, the second operation, the third operation, and the fourth operation, the control device performing another second operation of switching the second semiconductor element to the on-state by changing the potential of the gate electrode of the second semiconductor element from the third potential to the fourth potential, and
another third operation of switching the second semiconductor element to the off-state after the other second operation by changing the potential of the gate electrode of the second semiconductor element from the fourth potential to the third potential.

4. The device according to claim 3, wherein the first semiconductor element and the second semiconductor element are connected in series.

5. The device according to claim 4, further comprising an inductor,
one end of the inductor being connected between the first semiconductor element and the second semiconductor element.

6. A semiconductor device, comprising:
a plurality of semiconductor elements including a first semiconductor element and a second semiconductor element, each of the plurality of semiconductor elements including
a first semiconductor region of a first conductivity type,
a second semiconductor region provided on the first semiconductor region, the second semiconductor region being of a second conductivity type,
a third semiconductor region provided on a portion of the second semiconductor region, the third semiconductor region being of the first conductivity type,
a conductive portion provided inside the first semiconductor region with a first insulating portion interposed, and
a gate electrode provided on the conductive portion with a second insulating portion interposed, the gate electrode opposing, in a second direction with a gate insulating portion interposed, a portion of the first semiconductor region, the second semiconductor region, and at least a portion of the third semiconductor region, the second direction being perpendicular to a first direction, the first direction being from the first semiconductor region toward the second semiconductor region; and
a control device electrically connected to a plurality of the conductive portions and a plurality of the gate electrodes, the control device performing
a second operation of switching the first semiconductor element to an on-state by changing a potential of the gate electrode of the first semiconductor element from a third potential to a fourth potential, the fourth potential having a larger absolute value than the third potential,
a third operation of switching the first semiconductor element to an off-state after the second operation by changing the potential of the gate electrode of the first semiconductor element from the fourth potential to the third potential, and
a first operation of changing a potential of the conductive portion of the second semiconductor element from a first potential to a second potential after the second operation, the second potential having a larger absolute value than the first potential.

7. The device according to claim 6, wherein the third operation is performed simultaneously with the second operation or before the second operation.

8. The device according to claim 6, wherein the control device further performs a fourth operation of switching the second semiconductor element to the on-state after the second operation and the third operation by changing a potential of the gate electrode of the second semiconductor element from the third potential to the fourth potential.

9. The device according to claim 6, wherein the first semiconductor element is connected in series to the second semiconductor element.

10. The device according to claim 9, further comprising an inductor,
   the inductor being connected between the first semiconductor element and the second semiconductor element.

11. A control device electrically connected to a conductive portion and a gate electrode of a semiconductor element,
   the semiconductor element including
      a first semiconductor region of a first conductivity type,
      a second semiconductor region provided on the first semiconductor region, the second semiconductor region being of a second conductivity type,
      a third semiconductor region provided on a portion of the second semiconductor region, the third semiconductor region being of the first conductivity type,
      the conductive portion provided inside the first semiconductor region with a first insulating portion interposed, and
      the gate electrode provided on the conductive portion with a second insulating portion interposed, the gate electrode opposing, in a second direction with a gate insulating portion interposed, a portion of the first semiconductor region, the second semiconductor region, and at least a portion of the third semiconductor region, the second direction being perpendicular to a first direction, the first direction being from the first semiconductor region toward the second semiconductor region, the control device performing
   a first operation of changing a potential of the conductive portion from a first potential to a second potential, the second potential having a larger absolute value than the first potential,
   a second operation of switching the semiconductor element to an on-state by changing a potential of the gate electrode from a third potential to a fourth potential, the fourth potential having a larger absolute value than the third potential,
   a third operation of switching the semiconductor element to an off-state after the first operation and the second operation by changing the potential of the gate electrode from the fourth potential to the third potential, and
   a fourth operation of changing the potential of the conductive portion from the second potential to the first potential after the third operation.

12. The device according to claim 11, wherein the first operation is performed simultaneously with the second operation or before the second operation.

* * * * *